US011012047B2

(12) United States Patent
Fedosov (10) Patent No.: US 11,012,047 B2
(45) Date of Patent: May 18, 2021

(54) RESONANT RETUNABLE ANTENNA (71) Applicant: DEZEGA HOLDING UKRAINE LLC, Kyiv (UA)

(72) Inventor: Dmitriy Vitalyevich Fedosov, Omsk (RU)

(73) Assignee: DEZEGA HOLDING UKRAINE, LLC, Kyiv (UA)

( * ) Notice: Subject to any disclaimer, the term of this patent is extended or adjusted under 35 U.S.C. 154(b) by 0 days.

(21) Appl. No.: 16/511,132

(22) Filed: Jul. 15, 2019

(65) Prior Publication Data
US 2020/0021264 A1 Jan. 16, 2020

(30) Foreign Application Priority Data
Jul. 16, 2018 (RU) .................................. 2018126233

(51) Int. Cl.
*H01Q 1/50* (2006.01)
*H03H 7/38* (2006.01)
*H01F 27/28* (2006.01)

(52) U.S. Cl.
CPC ............... *H03H 7/38* (2013.01); *H01F 27/28* (2013.01); *H01Q 1/50* (2013.01)

(58) Field of Classification Search
CPC ........... H03H 7/38; H01F 27/28; H01F 21/12; H01Q 1/50; H01Q 5/50; H01Q 9/30;
(Continued)

(56) References Cited

U.S. PATENT DOCUMENTS

| 5,986,617 A * | 11/1999 | McLellan | H03H 7/38 323/355 |
| 2013/0009844 A1* | 1/2013 | Fedosov | H01Q 9/18 343/860 |

(Continued)

*Primary Examiner* — Dameon E Levi
*Assistant Examiner* — David E Lotter
(74) *Attorney, Agent, or Firm* — Soroker Agmon Nordman

(57) ABSTRACT

The invention relates to the antenna technology used generally for providing a communication in the mines, in particular to the small resonant re-tunable antennas intended for providing an induction communication too. The technical effect is a possibility to adjust smoothly an operation frequency of the antenna within the wide radio wave range and, as a consequence, a possibility to compensate an effect of the outer objects having a capacity and switch the antenna to the other transceiving frequency channels.

Re-tunable resonant antenna with matching device, the said antenna comprising a matching device in the form of a transformer consisting of a primary and secondary windings; a transmitting vibrator in the form of 2D- or 3D-conducting body, the said vibrator being connected to the secondary winding of the transformer and located in the magnetic field of the matching transformer, is characterized in that, proximal to the coils of the secondary solenoid of the transformer, there is a capacity component coupled galvanically to the matching transformer in any point and is moved along the axis of the solenoid.

Due to that the primary and secondary solenoids of the antenna transformer are made of sections which are connected in series via a relay, it is possible to retune a frequency not only within a single range, but to switch to the other range.

3 Claims, 8 Drawing Sheets

(58) Field of Classification Search
CPC .. H01Q 1/36; H01Q 5/10; H01Q 5/20; H01Q 5/314
See application file for complete search history.

(56) References Cited

U.S. PATENT DOCUMENTS

2014/0062814 A1* 3/2014 Gyenes ............... H01Q 9/30
343/745
2015/0048993 A1* 2/2015 Fedosov ............ H01Q 9/04
343/861

* cited by examiner

RESONANT RETUNABLE ANTENNA

The present invention relates to the antenna technology and can be used in the small-sized medium wave transceiving techniques for providing a mobile communication and induction communication, and as an individual antenna provided for installing on the stationary and mobile communication objects that is very actual in the mines and pits where the small-sized antennas are required. It is currently known that the dimensions of the efficient modern hectometre wave and decametre wave antennas are tens and hundreds meters that reduces significantly their use in the mobile communication, increases the time period required for stationary installing the antennas for providing a radio communication and makes their use under the conditions of limited space practically impossible. Such types of antennas prevent a development and use both of hectometre and decametre wave radio communication itself and the structures of the transceiving devices in the rage of long-wave, medium-Wave and short-wave radio communication. These radio-wave ranges are the most attractive for providing a radio communication in the mines both through the rock and via induction because such signals good propagate through the cable lines with minimal losses.

The antenna composed of a thin vibrator, a transformer on the ferrite ring, lengthening solenoid and counter-weight is disclosed in the utility model patent RU 154886. The frequency of this antenna is retuned via a removable electrode connected to the counter-weight inside the lengthening solenoid with the coils of which this electrode provides a capacity communication and bridges this lengthening solenoid.

Such construction cannot be used as a mobile antenna as the counter-weight increases significantly antenna volumes. Moreover, such construction where a thin long vibrator is used will be uncomfortable as a portable construction in the underground structures (mines and caves).

The construction of the proposed antenna does not comprise the ferrite cores that increases significantly a maximum power level of the input signal. The antenna is composed of a vibrator (transmitting component) being 2D- or 3D-conducting body having a capacity. It is the most convenient to use the vertically or horizontally disposed conducting cylinder as such vibrator. The antenna comprises a matching transformer as a primary and secondary windings, the transformer having a variable transformation coefficient. The transformer is located in such a manner that its magnetic field extends behind the transformer and encompasses a vibrator. A transformer magnetic field is a field with a sufficiently rapidly decreasing magnitude, actually located within the space which dimensions are not greater than several units of the linear dimensions of the transformer itself as a rule this space is sized to be less than 1% of the wavelength emitted by the antenna. In order to retune a resonant frequency, a mobile capacity component is placed proximal to the coils of the secondary winding of the transformer. The mobile capacity component being galvanically connected to any point of the transformer with a mechanism for manual or automatic moving of the mobile capacity component with respect to the secondary winding and fixing the mobile capacity component in the selected position. The mobile capacity component can be moved along the axis of the secondary solenoid whether approaching the coils or going away from them.

The vibrator being moved along the axis of the secondary solenoid for tuning the frequency can be used as such component.

In order to tune smoothly the resonant antenna not only within a single radio wave range, but make it possible to operate the antenna within several frequency ranges, the primary and secondary windings of the transformer are made of the several sections that are connected in series via a relay. The inductivity of the winding and the frequency range depend on the number of the connected sections.

Thus, the antenna enables the users of the mine induction communication systems to organize operatively both the stationary communication points and provide the communication on the run along the induction communication lines.

The closest prior art for the present device is the antenna of RU No 2488927 "Resonant retunable antenna with matching device". This antenna comprises a vibrator in the form of 2D- or 3D-conducting body, matching transformer on the open magnetic conductor a secondary winding of which transformer is connected to the vibrator and a primary winding thereof is powered. This antenna has very small dimensions and can be used in the mobile communication, however, it has a significant drawback, namely: a similar antenna structure can be efficiently used only for transmitting the signals of the portable radio stations of a small power ranging from 1 to 5 W as, when transmitting a signal of a great power, a ferrite core from which a magnetic conductor is made becomes magnetically saturated and is heated that does not allow to use these antennas for transmitting the power of a several tens and hundreds Watts that is particularly required in case of realizing a stationary radio communication centre.

The technical effect of the present invention is that it is possible to retune an operation frequency of a small antenna within significantly wide range while the signal sources of an increased power of tens and hundreds Watts are used and the small dimensions of the antenna are maintained that broadens the functionality of the radio equipment, in particular under conditions of a limited volume (mines, caves), furthermore, the antenna can be retuned to the other radio wave ranges.

The technical effect is achieved by placing an adjusting component in the form of a mobile capacity component (electrode) proximal to the secondary solenoid in accordance with the present invention in the antenna comprising a matching device in the form of a transformer made of a primary and secondary windings as well as a vibrator shaped as a 2D- or 3D-conducting body located within a magnetic field of the transformer and connected to the secondary winding of the transformer.

The mobile capacity component is moved along the axis of the secondary solenoid and the antenna includes a mechanism for moving the mobile capacity component, the mechanism can be an electro motor with a screw that lifts or lowers the mobile capacity component when a screw is rotated and hence changes an operation frequency of the antenna.

The antenna operation frequency is changed due to the change in bridging capacity between the coils of the secondary winding and adjusting the mobile capacity component. This frequency change is possible within the bandwidth of 10-20% of the band center. In order to transfer to the other frequency range, the primary and secondary windings of the transformer are made of several sections which are connected by means of relay. If the additional sections are connected, then a lower radio wave range is chosen and higher radio way range is chosen upon disconnection of the additional sections.

The present invention can be implemented in the industry by using the known technical means, technologies and materials, and meets the criterion of patentability "industrial applicability".

DETAILED DESCRIPTION

Figure 1:
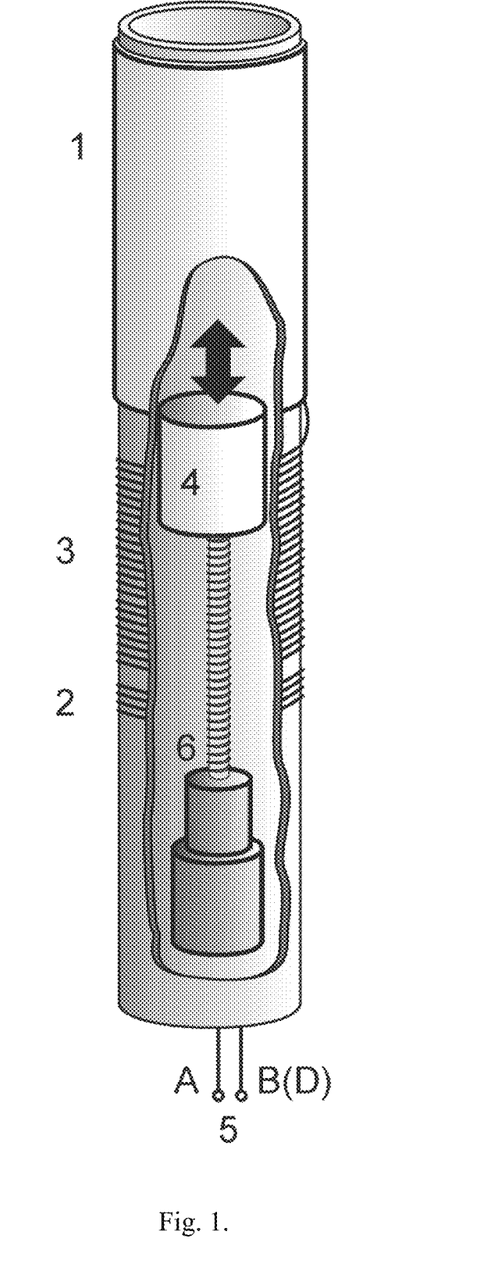
FIG. 1 is a perspective partial cross-sectional view of an antenna according to an exemplary embodiment of the present invention.

The present invention is explained by the drawings where FIG. 1 shows an antenna design map.

A dielectric pipe on which a 3D-conducting vibrator 1 in the form of a cylinder is placed, is used as an antenna framework. It can be made of a foil adhered to the framework.

The primary winding 2 and the secondary winding 3 of the transformer to which the antenna input 5 is connected are disposed on the framework. The mobile capacity component 4 that can be made of a foil is disposed inside the framework on the section of a plastic pipe. There is the movement mechanism 6 of the mobile capacity component 4 for tuning the antenna, the mechanism 6 consisting of an electric motor, gearbox and a screw which are placed on the axis of the secondary solenoid and when the mechanism 6 is rotated the capacity component moves along this axis.

Figure 2A:
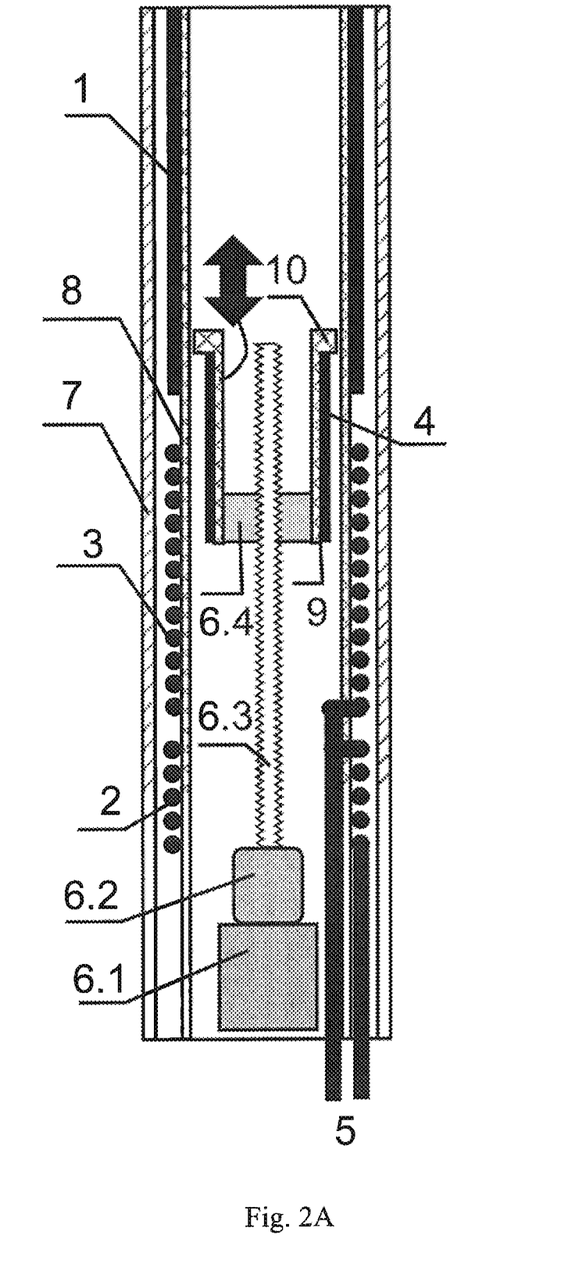
FIGS. 2A and 2B are sectional views of an antenna according to an exemplary embodiment of the present invention.
Figure 2B:
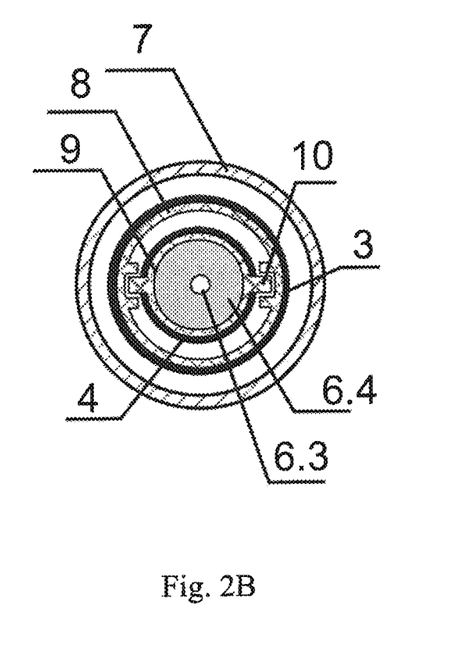
Figure 3A:
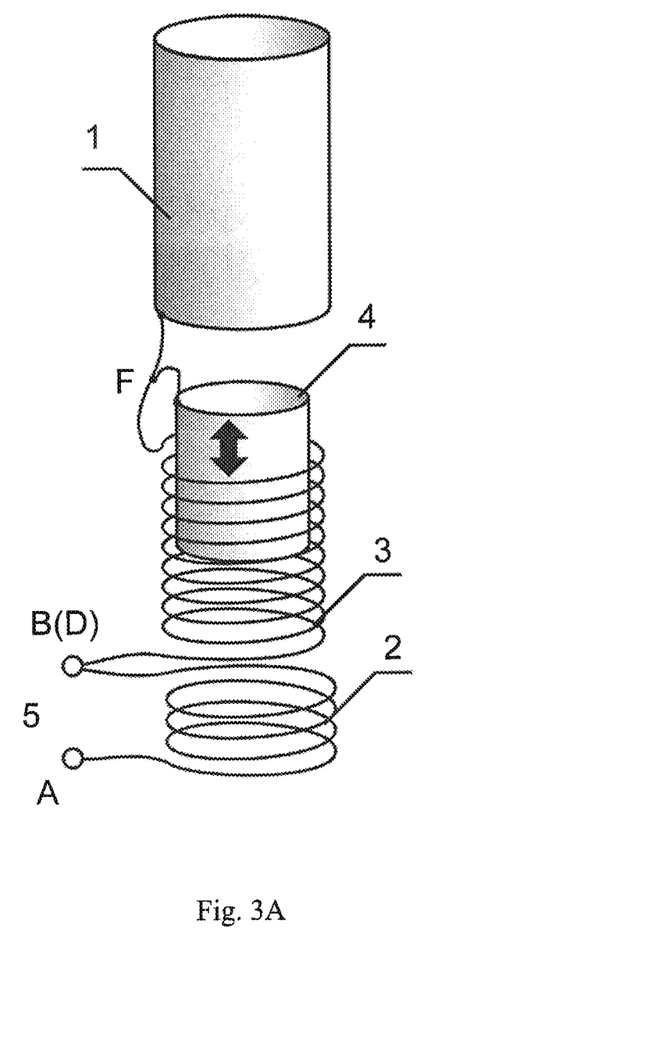
FIG. 3A shows a connection of a mobile capacity component of an antenna according to an exemplary embodiment of the present invention.
Figure 3B:
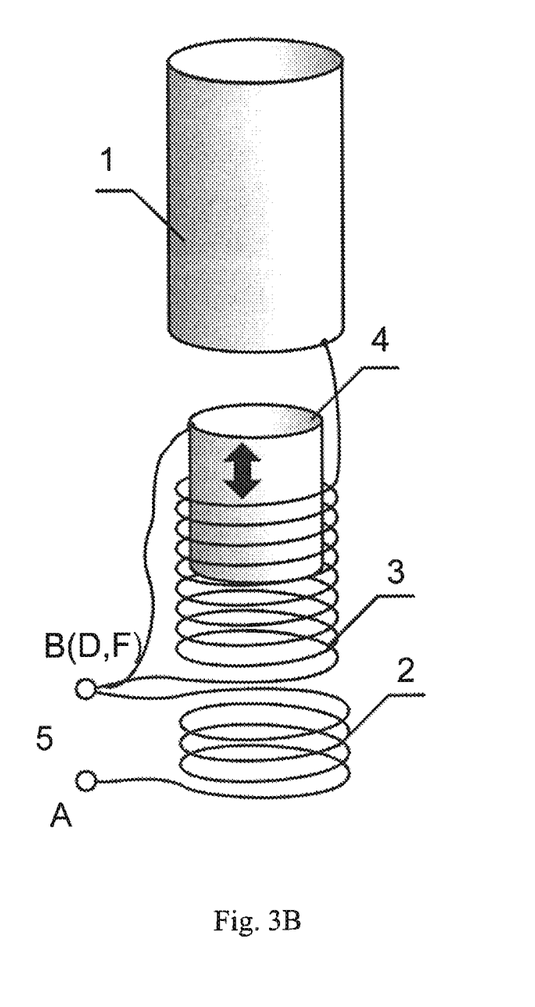
FIG. 3B shows a connection of a mobile capacity component of an antenna according to an exemplary embodiment of the present invention.

The antenna structure is shown in more details in the sections made in two planes in the FIGS. 2A and 2B. The antenna framework 8 is located in the protective casing 7, that is also made of a dielectric material. The movement mechanism 6 for adjusting the mobile capacity component 4 is composed of an electric motor 6.1, gearbox 6.2, screw 6.3 all of which are disposed on the axis of the transformer solenoids, a nut of dielectric material 6.4, within which a screw is rotated. Nut 6.4 is firmly secured in the pipe 9, on which the mobile capacity component 4 in the form of foil layer is disposed. In order to prevent the pipe 9 with nut 6.4 from turn over when the crew 6.3 is rotated and enable the pipe with screw to be lifted and lowered on the pipe 9 and on the antenna framework 8, there are the guides 10. The mobile capacity component 4 is connected to any point of the transformer, for example A, B, D or F, via a flexible insulated conductor. FIG. 3A shows a connection of the mobile capacity component 4 to the end of the secondary winding in the point F and FIG. 3B shows a connection of the mobile capacity component 4 to the points B and D, i.e, to the tail end of the primary solenoid and to the leading end of the secondary solenoid.

Figure 4:
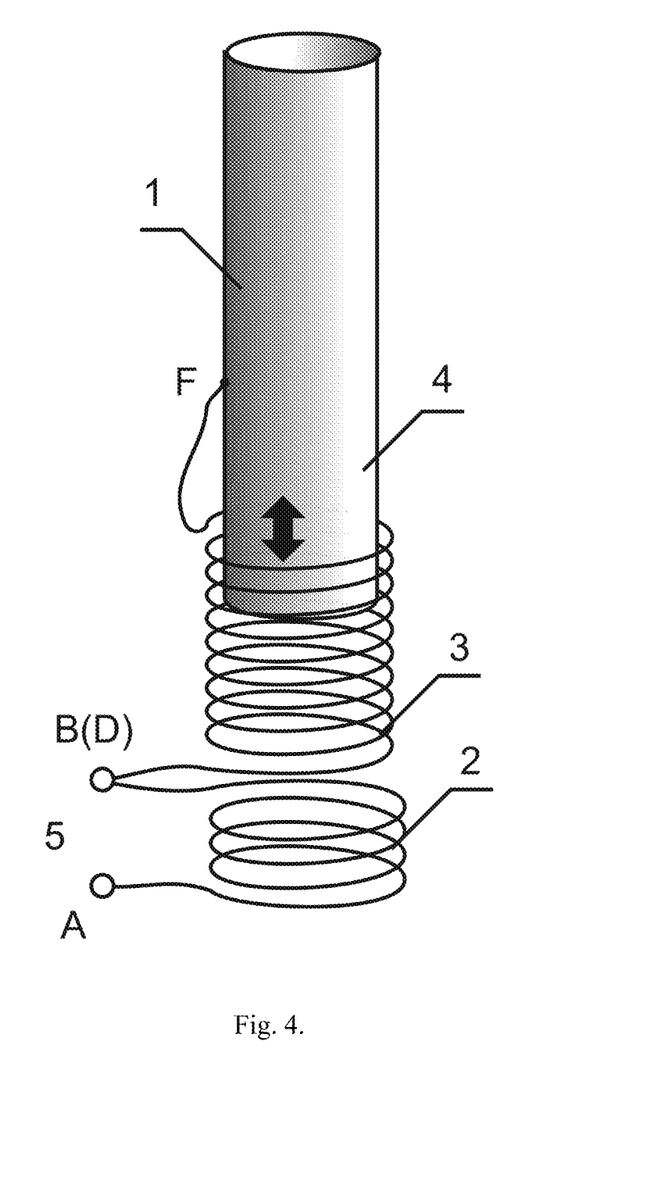
FIG. 4 shows an antenna with a vibrator according to an exemplary embodiment of the present invention.

FIG. 4 shows the antenna where the vibrator 1 plays the role of the mobile capacity component 4 and travels along the axis of the solenoid 3 inside it.

Figure 5:
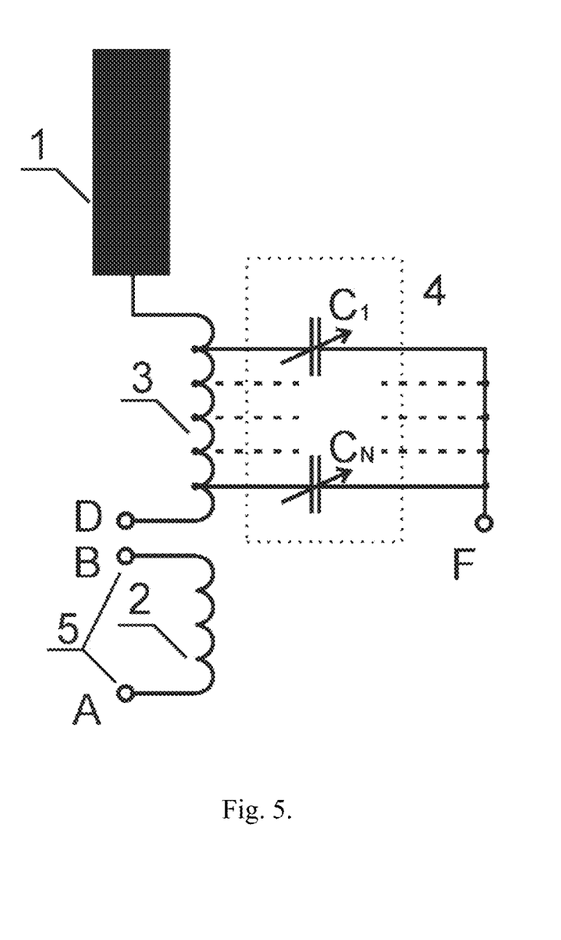
FIG. 5 is a circuit diagram showing an equivalent electric circuit of an antenna according to an exemplary embodiment of the present invention.

FIG. 5 shows the equivalent electric circuit of the antenna. The mobile capacity component 4 and the coils of the secondary solenoid form a series of the adjusting capacitors of variable capacity C1, C2 . . . CN, a capacity of which depends on the location of the mobile capacity component 4.

Figure 6:
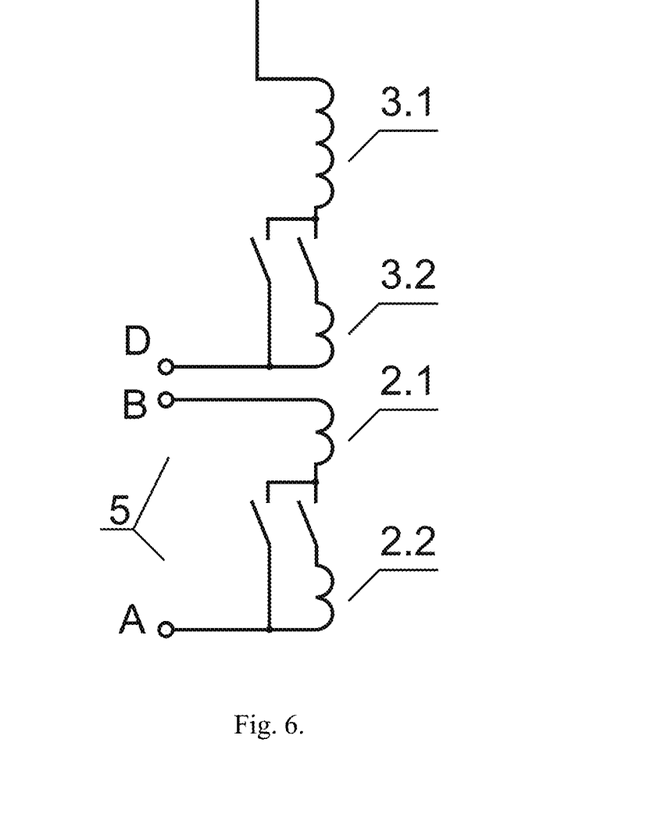
FIG. 6 is a circuit diagram showing a fragment of an electric circuit of a transformer of a dual band antenna according to an exemplary embodiment of the present invention.

FIG. 6 shows a fragment of the electric circuit of the transformer of the dual band antenna. The primary solenoid is composed of two segments 2.1 and 2.2, and the secondary solenoid is composed of segments 3.1 and 3.2. The segments 2.2 and 3.2 are connected to the solenoids via a relay. When these solenoids are connected, the antenna operates in the lower radio wave range and when they are disconnected, the antenna operates in the higher radio wave range. A multibandness of the antenna is achieved by means of such technical solution.

The antenna operates as follows.

When a high-frequency signal is supplied to the primary winding 2 of the transformer, a magnetic field inducing a magnetic field in the secondary solenoid 3 is generated in the primary winding 2. A magnetic field is generated around the transformer a magnetic induction vector of which is directed along the secondary solenoid. An electric field a strength vector of which is directed perpendicular to the surface of the vibrator 1 is generated due to that a high voltage is supplied to the vibrator from the secondary step-up winding 3 of the transformer, the transformer being electrically coupled to the vibrator 1. In view of that, a surface of the vibrator 1 is within the zone of a magnetic field of the transformer so that the angle between a magnetic induction vector and a strength vector of the electric field generated on the vibrator is close to 90°, the conditions sufficient for generating radio waves appear proximal to the vibrator.

As the antenna is resonant and is an open oscillating circuit, a resonant frequency is altered when any additional reactive components are added to the circuit. Such reactive component is the mobile capacity component 4 that bridges the secondary winding of the transformer, causes a change in the resonant frequency and retunes the antenna to the other frequency. This permits to retune the antenna frequency within the rage from 10 to 20% of the band center. In order to transfer to the other range, it is required to disconnect or connect the parts of the sections of the primary solenoid 2 and secondary solenoid 3 of the transformer.

The invention claimed is:

1. Antenna with a matching device, said antenna comprising:
   the matching device in the form of a transformer consisting of primary and secondary windings; a transmitting vibrator in the form of a 2D- or 3D-conducting body, the transmitting vibrator being connected to the secondary winding and located in the magnetic field of the matching transformer, characterized in that, proximal to the secondary winding of the matching transformer, there is a mobile capacity component coupled galvanically to the matching transformer at any point and a mechanism for manual or automatic moving of the mobile capacity component with respect to the secondary winding and fixing the mobile capacity component in a selected position.

2. Antenna of claim 1, characterized in that the transmitting vibrator connected to the secondary winding of the matching transformer is combined with the mobile capacity component and is moved along the axis of the secondary winding.

3. Antenna of claim 1, characterized in that the primary and secondary windings are divided into several sections, which are connected via a relay.

* * * * *